US012805334B2

(12) United States Patent
Lan et al.

(10) Patent No.: US 12,805,334 B2
(45) Date of Patent: Nov. 17, 2026

(54) ELECTROMAGNETIC INTERFERENCE SHIELD HAVING MESH GRID GROUND FENCE METALLIZATION PATTERN

(71) Applicant: QUALCOMM Incorporated, San Diego, CA (US)

(72) Inventors: Je-Hsiung Lan, San Diego, CA (US); Hong-Ming Lee, San Diego, CA (US); Jonghae Kim, San Diego, CA (US); Kai Liu, San Diego, CA (US); Nosun Park, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 308 days.

(21) Appl. No.: 18/758,120

(22) Filed: Jun. 28, 2024

(65) Prior Publication Data

US 2026/0005154 A1 Jan. 1, 2026

(51) Int. Cl.

| | |
|---|---|
| ***H10W 42/20*** | (2026.01) |
| ***H10W 70/05*** | (2026.01) |
| ***H10W 70/65*** | (2026.01) |
| ***H10W 70/685*** | (2026.01) |
| ***H10W 90/00*** | (2026.01) |

(52) U.S. Cl.

CPC ........... *H10W 42/20* (2026.01); *H10W 70/05* (2026.01); *H10W 70/093* (2026.01); *H10W 70/65* (2026.01); *H10W 70/685* (2026.01); *H10W 90/701* (2026.01); *H10W 90/724* (2026.01)

(58) Field of Classification Search

CPC ... H10W 42/20; H10W 70/05; H10W 70/093; H10W 70/65; H10W 70/685; H10W 90/701; H10W 90/724; H10W 44/248; H10W 44/20; H10W 20/423; H10W 20/43; H10W 20/497; H04B 15/04

See application file for complete search history.

(56) References Cited

U.S. PATENT DOCUMENTS

| | | | |
|---|---|---|---|
| 2016/0056226 A1 | 2/2016 | Song et al. |
| 2017/0353211 A1 | 12/2017 | Roy et al. |
| 2023/0232528 A1 | 7/2023 | Wu et al. |
| 2023/0253339 A1 | 8/2023 | McLaren et al. |

OTHER PUBLICATIONS

International Search Report and Written Opinion—PCT/US2025/030220—ISA/EPO—Oct. 22, 2025.

*Primary Examiner* — Dao H Nguyen

(74) *Attorney, Agent, or Firm* — Muncy, Geissler, Olds & Lowe, P.C.

(57) ABSTRACT

An electronic device includes at least a first radio frequency (RF) path structure and a second RF path structure; and an electromagnetic shield disposed between the first RF path structure and the second RF path structure. The electromagnetic shield comprises a plurality of fence posts extending through at least one dielectric layer and having first ends electrically connected to a common ground metallization layer, and at least one metallization layer overlying the at least one dielectric layer and electrically interconnecting second ends of the plurality of fence posts. The at least one metallization layer interconnects the second ends of the plurality of fence posts in a conductive mesh pattern.

20 Claims, 11 Drawing Sheets

ELECTROMAGNETIC INTERFERENCE SHIELD HAVING MESH GRID GROUND FENCE METALLIZATION PATTERN

FIELD OF DISCLOSURE

The present disclosure generally relates to electromagnetic interference shields, and more particularly, to electromagnetic interference shields suitable for electromagnetically isolating components of an integrated radio frequency device.

BACKGROUND

Integrated circuit (IC) technology has achieved great strides in advancing computing power through miniaturization of electrical components. An IC may be implemented in the form of an IC chip that has a set of circuits integrated thereon. In some implementations, one or more IC chips can be physically carried and protected by an IC package, where various power and signal nodes of the one or more IC chips can be electrically coupled to respective conductive terminals of the IC package via electrical paths formed in a package substrate of the IC package. Various packaging technologies can be found in many electronic devices, including processors, servers, radio frequency (RF) integrated circuits, etc. Advanced packaging and processing techniques can be used to implement complex devices, such as multi-electronic component devices and system on a chip (SOC) devices, which may include multiple function blocks, with each function block designed to perform a specific function, such as, for example, a microprocessor function, a graphics processing unit (GPU) function, a communications function (e.g., WiFi, Bluetooth, and other communications), and the like.

The electronic packaging industry has pursued the path of miniaturization, seeking to pack more functionality into smaller devices. One aspect of this trend is the design and fabrication of radio frequency (RF) devices, characterized by their configuration of RF integrated circuits and passive RF devices. RF power splitters constitute a common form of passive RF device, characterized by their implementation using surface mount resistors and capacitors. However, as the industry pushes for greater density and performance, there is a shift toward reducing the size of such devices, which introduces manufacturing challenges.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an electronic device includes at least a first radio frequency (RF) path structure and a second RF path structure; and an electromagnetic shield disposed between the first RF path structure and the second RF path structure, the electromagnetic shield comprising a plurality of fence posts extending through at least one dielectric layer and having first ends electrically connected to a common ground metallization layer, and at least one metallization layer overlying the at least one dielectric layer and electrically interconnecting second ends of the plurality of fence posts, wherein the at least one metallization layer interconnects the second ends of the plurality of fence posts in a conductive mesh pattern.

In an aspect, a radio frequency (RF) splitter includes a first set of electronic components configured to pass first RF signals; a second set of electronic components configured to pass second RF signals; and a plurality of fence posts extending through at least one dielectric layer and between the first set of electronic components and the second set of electronic components, wherein the plurality of fence posts have first ends electrically connected to a common ground metallization layer, and at least one metallization layer overlying the at least one dielectric layer and electrically interconnecting second ends of the plurality of fence posts, wherein the at least one metallization layer interconnects the second ends of the plurality of fence posts in a conductive mesh pattern.

In an aspect, a customer premises equipment (CPE) includes a substrate; a plurality of antennas overlying a first side of the substrate; and a hybrid integrated passive (HIP) chip overlying a second side of the substrate, wherein the HIP includes a radio frequency (RF) power splitter comprising: a first RF path structure configured to pass a first RF signal to at least a first antenna of the plurality of antennas; a second RF path structure configured to pass a second RF signal to at least a second antenna of the plurality of antennas an electromagnetic shield disposed between the first RF path structure and the second RF path structure, the electromagnetic shield comprising: a plurality of fence posts extending through at least one encapsulated molding compound layer and having first ends electrically connected to a common ground metallization layer at the second side of the substrate, and at least one metallization layer overlying the at least one encapsulated molding compound layer and electrically interconnecting second ends of the plurality of fence posts, wherein the at least one metallization layer interconnects the second ends of the plurality of fence posts in a conductive mesh pattern.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings, which are presented solely for illustration and not limitation of the disclosure.

Figure 1:
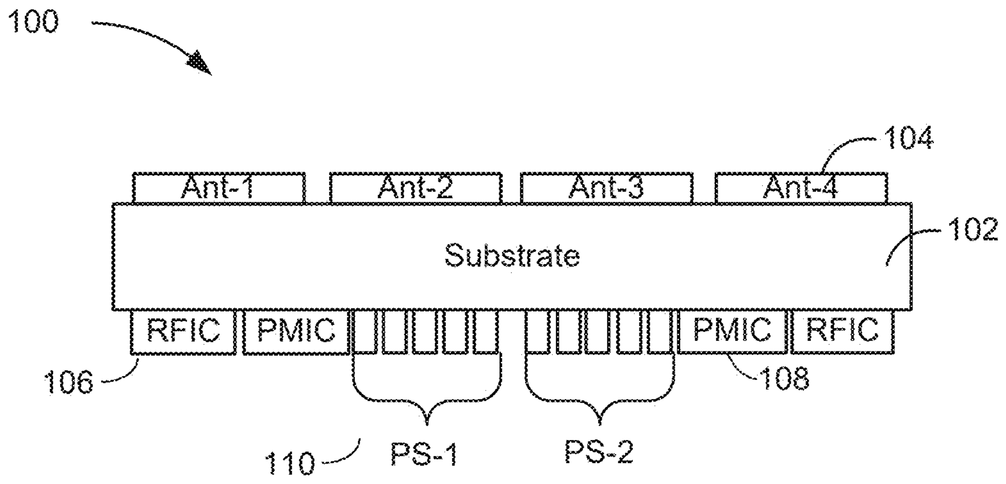
FIG. 1 shows an example radio frequency (RF) device, according to aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description, and related drawings are directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It will also be understood that when a layer is described as "over," "overlying," "under," "underlying," another layer does not necessarily preclude the use of intermediate layers and/or materials that may otherwise be used to ensure adhesion between the layers. Still further, it will be understood that when a layer is described as "over," "overlying," "under," "underlying," another layer that such terms are used with reference to the orientations of such layers as depicted in the reference frame shown in the corresponding figures.

In an aspect, the present disclosure is directed to electromagnetic isolation of radio frequency components in microelectronic packaging scenarios. In various aspects, the disclosure describes implementations of a compact mesh-grid ground fence electromagnetic (EM) shielding structure having a small footprint yet exceptional isolation properties. In an aspect, the disclosed EM shield structure is applied in the context of a radio frequency (RF) signal splitter. In an aspect, the splitter may be used in customer premises equipment in which RF signals are split into signals having different polarization properties.

The rapid advancement of telecommunications technology has led to the widespread use of Customer Premises Equipment (CPE) devices, such as modems, routers, and set-top boxes, which serve as critical gateways for Internet, television, and telephone services in residential and commercial settings. These devices are equipped with sophisticated electronics that require optimal performance to ensure uninterrupted and high-quality service delivery. One of the persistent challenges in maintaining the performance and reliability of CPE devices is the mitigation of electromagnetic interference (EMI) in microelectronic devices used in such CPE devices.

Electromagnetic interference can emanate from various sources, including electronic RF components in close proximity with one another on the same RF device (e.g., the same CPE device). EMI can degrade the performance of such electronic circuits, leading to data loss, decreased signal quality, and operational malfunctions. As a result, shielding against EMI is employed for the effective functioning of CPE devices.

Electromagnetic shielding involves the use of materials and structures that block or attenuate electromagnetic fields, thereby protecting sensitive electronic components from external and internal sources of interference. Traditional shielding methods employed on CPE modules have typically employed electromagnetic shields disposed between components on devices that are sensitive to EMI. However, current EMI shield structures can be large and limit the ability of designers to effectively use available space on, for example, substrate surfaces. Such limitations also be size constraints on the miniaturization of such devices.

In current CPE modules, power splitters are implemented by assembling discrete surface mount devices (SMD) (resistors and capacitors) on a laminate substrate. Typically, the splitter size is large. The control of the SMD variation is achieved by component binning/sorting with tight tolerance specs (<2%). Such tight tolerance specifications may be necessary in various scenarios to ensure a low signal phase delta (<2.5 degree) between the orthogonally vertical and horizontal paths of the adjacent splitters. In general, however, SMD component variation is 10% and the resulting phase delta of such devices is often greater than 20 degrees.

Achieving SMD with <2% variation, however, substantially increases the SMD cost (e.g., five times more expensive in some scenarios).

Good isolation of greater than −50 dB is often needed between splitters used to split RF signals having orthogonal polarization characteristics (e.g., vertically polarized RF signals and horizontally polarized RF signals). In general, the splitters must be spaced a distance >2 mm to meet the isolation specifications. Although increasing the splitter spacing between the vertical and horizontal polarization paths can improve the vertical signal path (aka V-path) and the horizontal signal path (aka H-path) splitter isolation, the larger device size resulting from the large splitter spacing is not desirable from cost and device miniaturization perspectives, as the integrated splitter chip will become larger and hence more costly.

FIG. 1 shows an example RF device 100, according to aspects of the disclosure. In this example, the RF device 100 includes a substrate 102 to support various components of the RF device 100. Here, a plurality of antennas 104 are disposed on a first side of the substrate 102 while both active and passive RF components are disposed on the second side of the substrate 102 opposite the first side. In an aspect, the active RF components may include one or more RF integrated circuits (RFICs) 106 and one or more power management integrated circuits (PMICs) 108. The passive RF components in this example form a power splitter 110 configured to split RF power into at least two outputs (e.g., PS-1 and PS-2). In a typical scenario, the power splitter 110 comprises a plurality of surface mount devices (e.g., resistors, capacitors, etc.). In an aspect, the output ports PS-1 and PS-2 are separated by an EMI shield structure (not shown in FIG. 1). However, the combination of passive surface mount RF components and conventional EMI shield structures used in such devices may occupy a substantial amount of space on the second side of the substrate 102.

Figure 2:
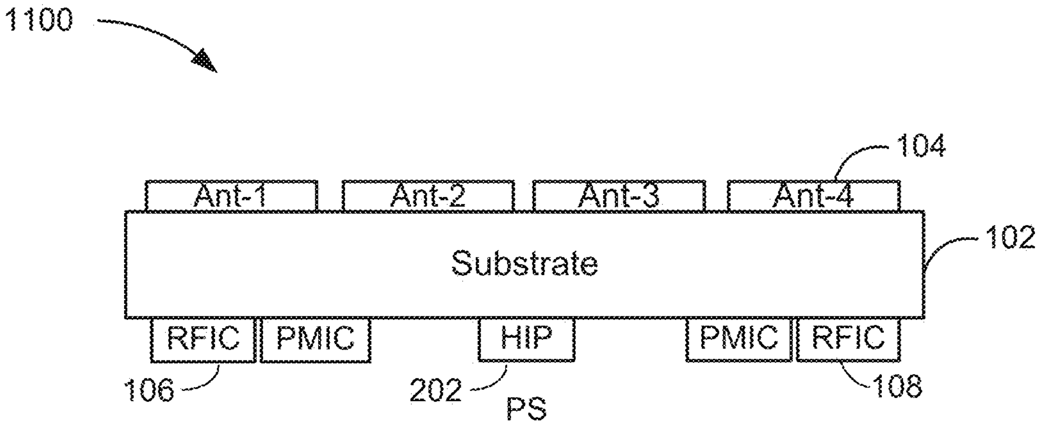
FIG. 2 shows an example RF device employing an improved power splitter, according to aspects of the disclosure.

FIG. 2 shows an example of an RF device 200 employing an improved power splitter, according to aspects of the disclosure. Similar components shown in FIG. 1 are referenced in the RF device 200 of FIG. 2 with the same reference numbers. However, the power splitter 202 in the RF device 200 are formed as a hybrid integrated passive (HIP) chip having a size that is substantially reduced than the power splitter 110 shown in FIG. 1. The reduction in the size of the RF power splitter 202, for example, is at least partially attributable to an EMI shield structure that allows the components of the power splitter 2022 be formed in closer proximity with one another while still maintaining a same and/or, improved EMI performance, according to aspects of the disclosure. In an aspect, the RF device 200 may be integrated as a single hybrid integrated passive (HIP) chip. In certain scenarios, the 10% variations associated with the binning of SMD components may be reduced to, for example, 2% by integrating the passives components (R, C, and L)) by using the HIP technology and building the splitters in a compact integrated circuit chip, thereby resulting in greater manufacturing control with smaller component variation.

Figure 3:
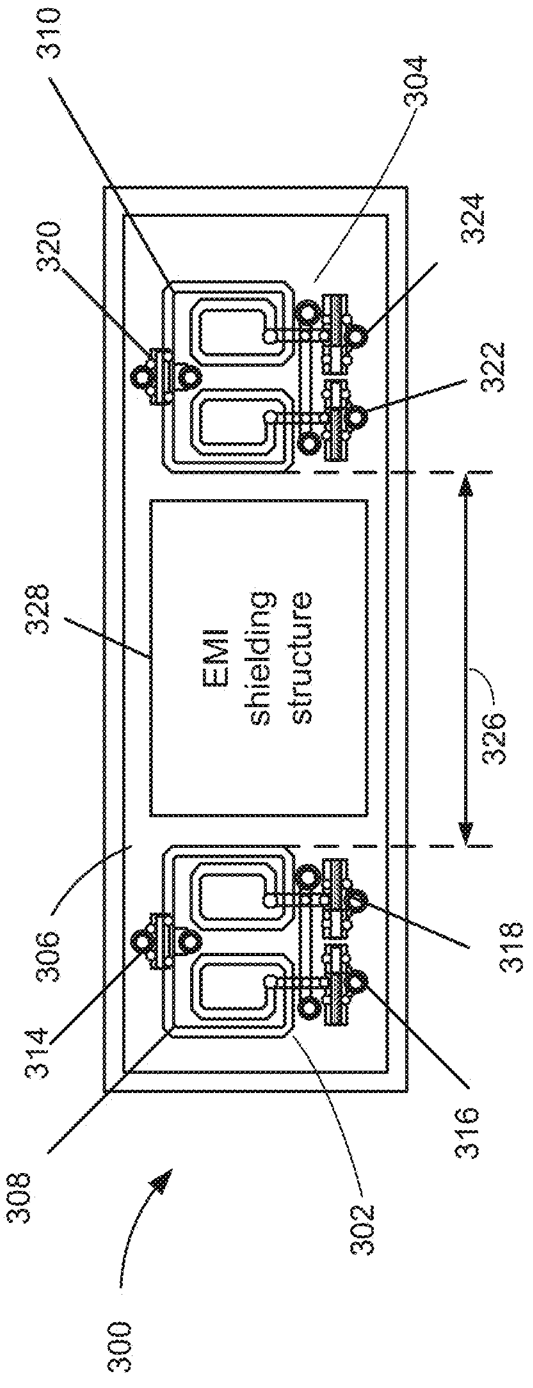
FIG. 3 is a top plan view of an example power splitter employing a conventional EMI shielding structure, according to aspects of the disclosure.

FIG. 3 is a top plan view of an example power splitter 300 employing a conventional EMI shielding structure, according to aspects of the disclosure. Two RF conductive paths are formed by two RF splitter structures 302 and 304 on the same side of a substrate 306. In an aspect, the RF splitter structure 302 may form an RF path for RF signals with a vertical polarization while the RF splitter 304 may form in RF path for RF signals with a horizontal polarization. In this example, RF splitter structure 302 includes an input port 314 and two output ports 316 and 318. Similarly, RF splitter structure 304 includes an input port, 320 and two output ports 322 and 324.

A conventional EMI shielding structure 328 is disposed on the surface of the substrate 306 to electromagnetically isolate the RF splitter structures 302 and 304 from one another. In an aspect, conventional EMI shielding structures 328 may be formed by a plurality of disconnected metal fence posts. However, the ability of such disconnected metal fence posts to effectively isolate the RF splitter structures 302 and 304 from one another requires a substantial spacing 326 (e.g., 1 millimeters) between components (e.g., inductors 308 and 310) at the edge of the RF splitter structures 302 and 304 to meet most RF isolation requirements.

Figure 4:
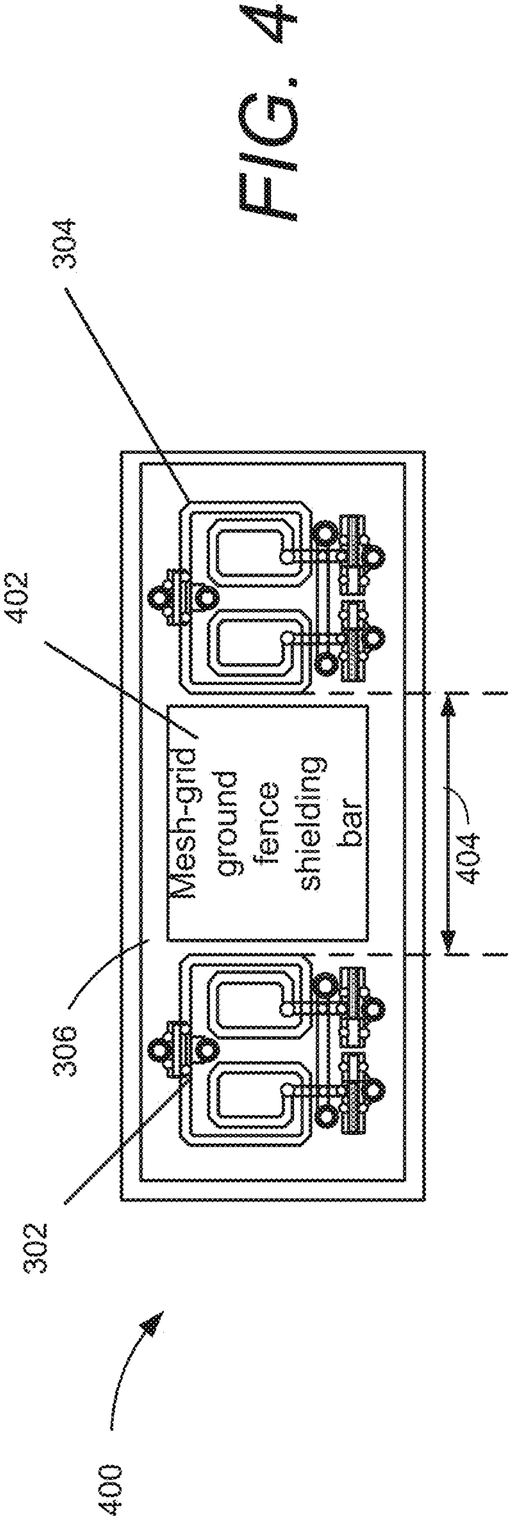
FIG. 4 is a top plan view of an example power splitter employing an EMI shielding structure, according to aspects of the disclosure.

FIG. 4 is a top plan view of an example power splitter 400 employing an EMI shielding structure, according to aspects of the disclosure. However, the power splitter 400 shown in FIG. 4 employs a mesh-grid ground fence shielding structure 402 (referenced herein as an MGFS) constructed according to aspects of the disclosure. In an aspect, the MGFS 402 provides substantially more EMI isolation between the RF splitter structures 302 and 304 than the EMI isolation provided by the EMI shielding structure 328. Additionally, the MGFS 402 occupies substantially less real estate on the surface of substrate 306. As such, the RF splitter structures 302 and 304 may be placed closer to one another. For example, the interior edges of the RF splitter structures 302 and 304 may be spaced from one another by a smaller distance 404 than the substantial spacing 326 of the power splitter 300 shown in FIG. 3. In various examples, the distance 404 may be smaller than or equal to 400 micrometers, with a spacing of 360 micrometers being readily achieved. In some examples, the real estate occupied by the MGFS 402 may be reduced to about 1.8 $mm^2$ compared to the 18 $mm^2$ often occupied by conventional EMI shielding structures (e.g., EMI shielding structure 328) conventionally used by the splitters built by SMD resistors and capacitors on laminate substrate. In an aspect, the example power splitter 400 may be configured as a single integrated device in the form of an HIP chip.

Figure 5:
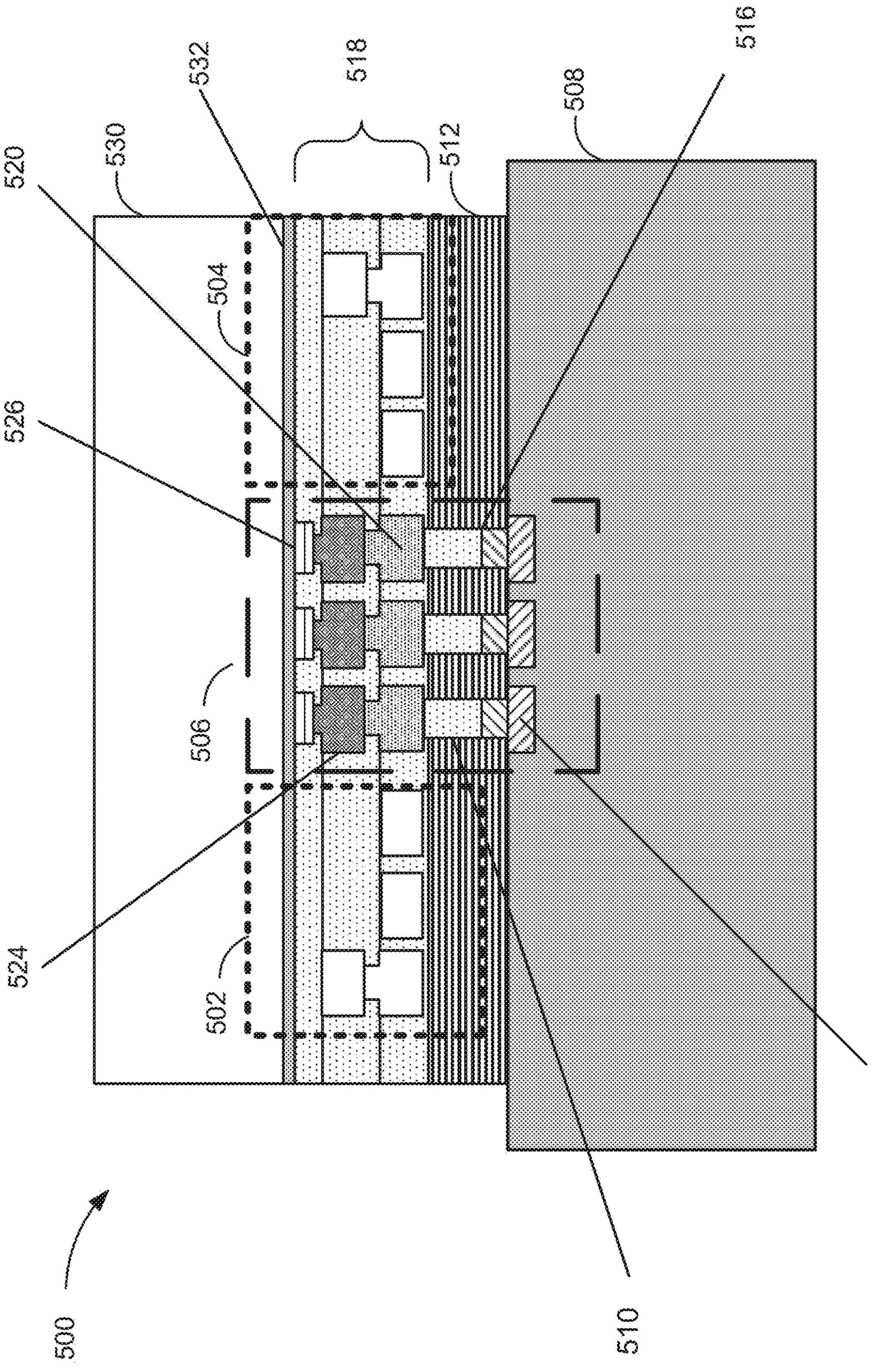
FIG. 5 is a cross-sectional view of an example RF device incorporating an EMI shielding structure, according to aspects of the disclosure.

FIG. 5 is a cross-sectional view of an example RF device 500 incorporating an EMI shielding structure, according to aspects of the disclosure. As disclosed in further detail herein, the RF device 500 includes at least a first radio frequency (RF) path structure 502 and a second RF path structure 504. In an aspect, the RF paths 502 and 504 correspond to the components of an RF splitter (e.g., RF splitter structures 302 and 304 shown in FIG. 3 and FIG. 4) carrying RF signals. In an aspect, RF path structure 502 conducts an RF signal having a vertical polarity while RF path structure 504 conducts RF signals having a horizontal polarity. An MGFS 506 is disposed between the first RF path structure 502 and the second RF path structure 504. In accordance with aspects of the disclosure, the MGFS 506 and RF path structures 502 and 504 are disposed on the same surface of a substrate 508.

In an aspect, the MGFS 506 includes a plurality of fence posts 510 extending through at least one dielectric layer 512. In an aspect, the plurality of fence posts 510 are comprised of copper pillar structures. In an aspect, the dielectric layer 512 may be formed from an encapsulated molding compound (e.g., materials for RF applications having a low loss tangent with a proper coefficient of thermal expansion for the flip chip bonding of the power splitter to the substrate). The first ends of the plurality of fence posts 510 are in electrical communication with a common ground metallization layer 514 formed in the substrate 508. In accordance with certain aspects of the disclosure, the first ends of the plurality of fence posts 510 may be in electrical contact with the common ground metallization layer 514 through one or more of the copper pillar or solder bumps 516.

The MGFS 506 may include one or more metallization layers 518 overlying the dielectric layer 512. The metallization layers 518 electrically interconnect the second ends of the plurality of fence posts 510 in a conductive mesh pattern. In FIG. 5, the metallization layers forming the conductive mesh pattern include the metalized via structures 520 of a first redistribution layer, the metalized vias structures 522 of a second redistribution layer, and metalized elements 524 (e.g., connection pads) of an M3 metallization layer.

In an aspect, a substrate 530 to hold the HIP splitter chip may be mounted to overlie a buried oxide (BOX) layer 532 disposed between the lower surface of the M3 layer and the upper surface of the silicon substrate 530. In various scenarios, the high resistivity silicon substrate 530 may comprise an HIP chip and a high resistivity silicon substrate.

In an aspect, the MGFS may include a plurality of fence posts arranged in at least three linear rows so that fence posts of adjacent linear rows of the at least three linear rows are arranged as diagonally oriented sets of fence posts. A conductive mesh pattern interconnects the plurality of fence posts. In an aspect, the conductive mesh pattern includes a plurality of diagonally oriented metallization lines electrically interconnecting each set of the diagonally oriented sets of fence posts.

Figure 6:
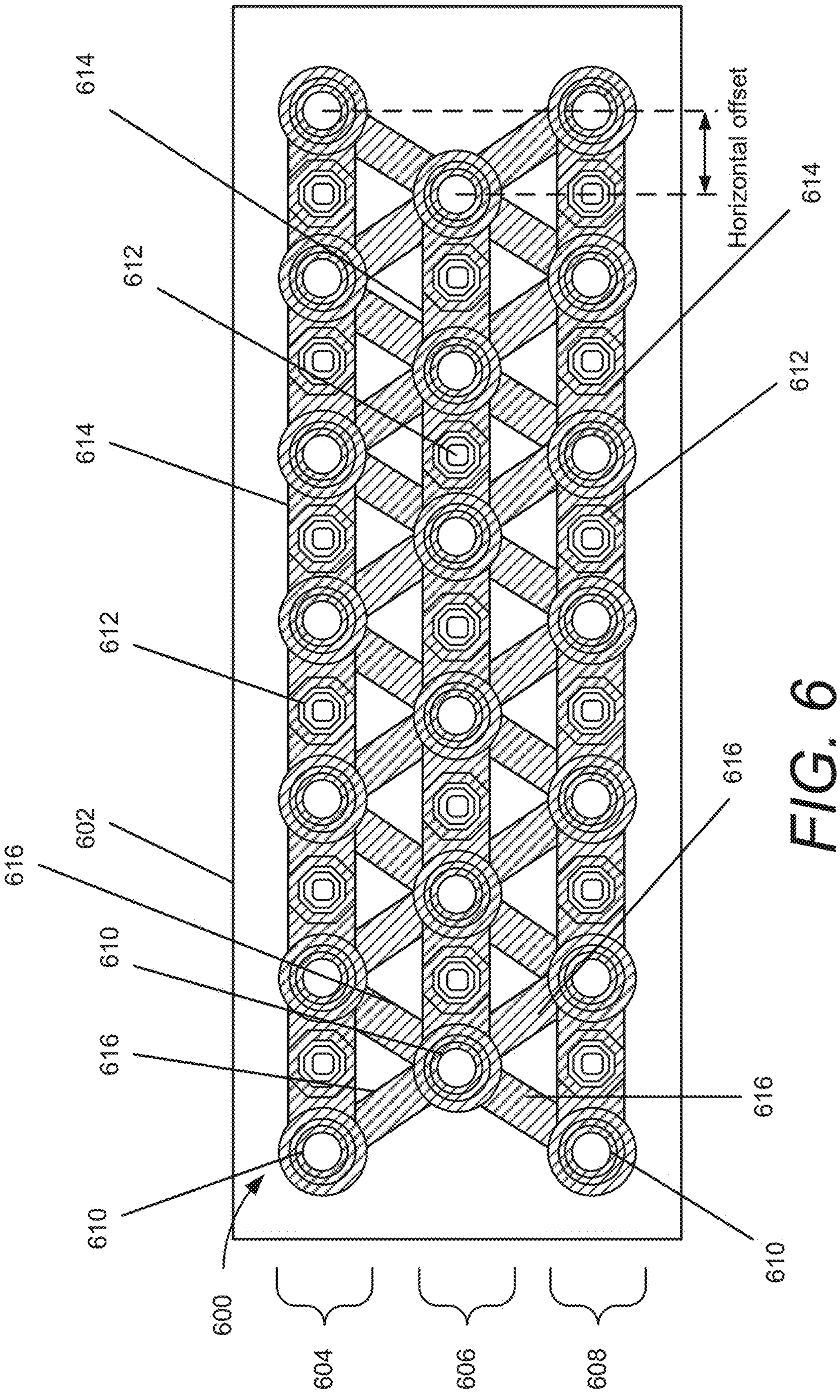
FIG. 6 is a top plan view of an example mesh-grid ground fence shielding structure (MGFS), according to aspects of the disclosure.

FIG. 6 is a top plan view of an example mesh-grid ground fence shielding structure (MGFS) 600, according to aspects of the disclosure. In this example, the MGFS 600 includes three rows 604, 606, and 608 of fence posts structures 610 interconnected by a metalized mesh structure. In this example, the metalized mesh structure is comprised of horizontal (as viewed in the orientation of the MGFS shown in FIG. 6) optional metalized structures 612 that electrically interconnect the fence post structures 610 aligned in each row 604, 606, and 608. Each fence post structure 610 within each row of fence posts 604, 606, and 608 are electrically interconnected by a horizontal metallization structure 614 of the row. In this example, the horizontal metallization structures 614 of each row also electrically interconnect the metalized structures 612 of the row.

In FIG. 6, the fence post structures 610 are horizontally offset (as viewed based on the orientation of the MGFS 600 shown in FIG. 6) from the fence post structures 610 of the adjacent rows. Accordingly, the metalized mesh structure of the MGFS 600 may also include a plurality of diagonally oriented metallization structures 616 interconnecting the offset fence post structures 610 of the adjacent rows 604, 606, and 608. As described with respect to the cross-sectional view of the RF device 500 shown in FIG. 5, the metalized mesh structure of the MGFS 600 may be formed from one or more redistribution layers (e.g., RDL1 and RDL2 layers) and/or one or more metallization layers (e.g., M3 layer) of the power splitter. In an aspect, the MGFS structure can be formed with thick/tall M3-RDL1-RDL2 metal layers and interlayer dielectric (ILD) vias.

In an aspect, the MGFS may include a plurality of fence posts arranged as a single linear row and a conductive mesh pattern. In an aspect, the conductive mesh pattern comprises a primary linear metallization line electrically interconnecting each fence post of the plurality of fence posts, one or more linear metallization lines parallel to the primary linear metallization line, and a plurality of diagonally oriented metallization lines electrically interconnecting the one or more linear metallization lines with the primary linear metallization line.

Figure 7:
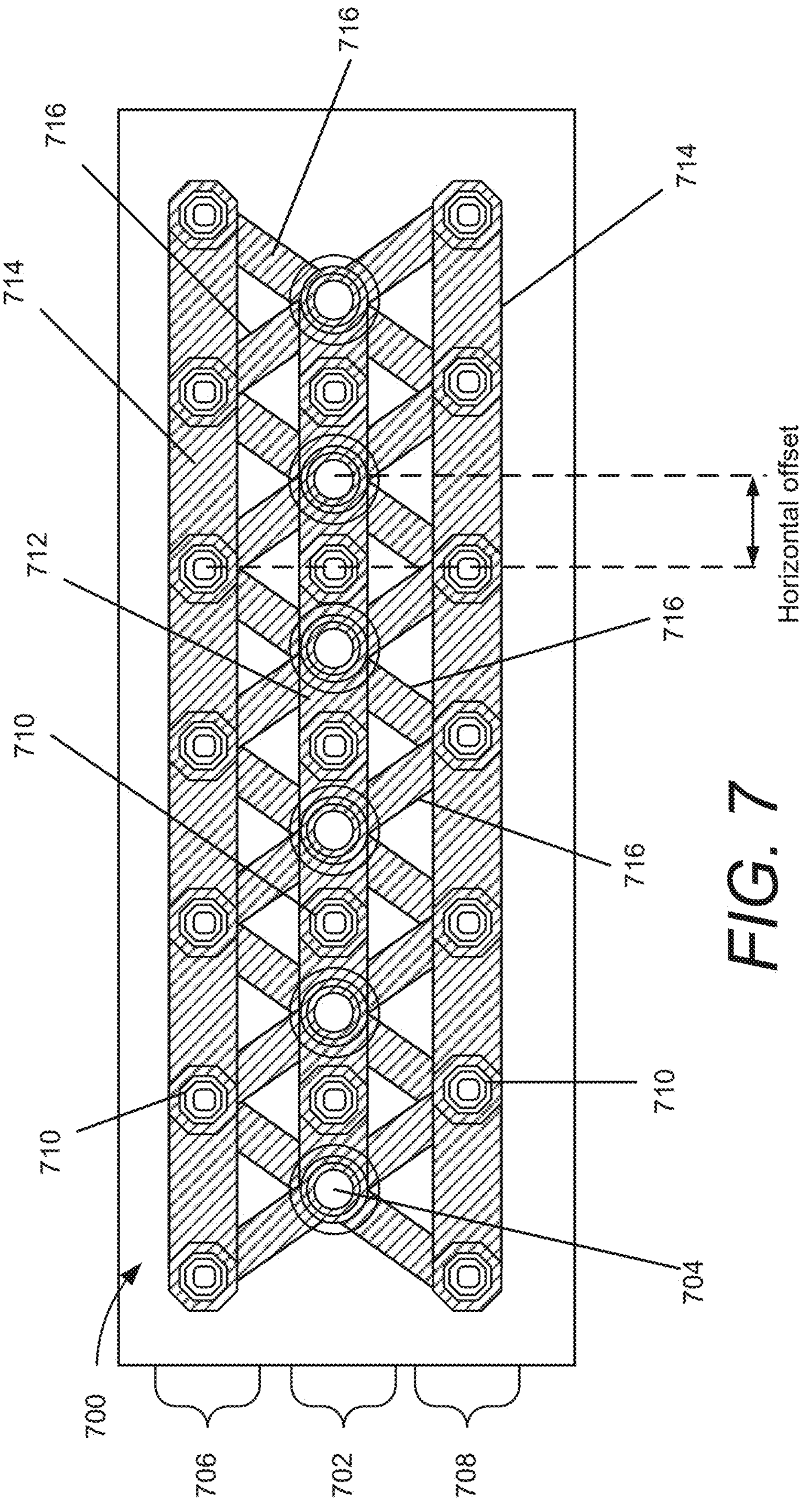
FIG. 7 is a top plan view of another example of an MGFS, according to aspects of the disclosure.

FIG. 7 is a top plan view of another example of an MGFS 700, according to aspects of the disclosure. In this example, the MGFS 700 includes a single row 702 of fence post structures 704 between an opposed pair of rows 706 and 708 of metalized structures 710. The fence post structures 704 of row 702 are interconnected by a metalized mesh structure. In this example, the metalized mesh structure includes a plurality of metallization structures that electrically interconnect the fence post structures 704 of row 702 and the metalized structures 710 of rows 706 and 708 with one another. In this example, the metalized mesh structure includes a horizontal metallization structure 712 that electrically interconnects the fence post structures 704 of row 702. Additionally, the metallized mesh structure includes a horizontal metallization structure 714 respectively associated with each row 706 and 708. Each horizontal metallization structure 714 electrically interconnects the metallization structures 710 of the respective row.

In FIG. 7, the fence post structures 704 of row 702 are horizontally offset from the metallization structures 710 of the adjacent rows 706 and 708. Accordingly, the metalized mesh structure of the MGFS 700 may also include a plurality of diagonally oriented metallization structures 716 interconnecting the fence post structures 704 of row 702 with the metallization structures 710 of the adjacent rows 706 and 708.

As described with respect to the cross-sectional view of the RF device 500 shown in FIG. 5, the metalized mesh structure of the MGFS 700 may be formed from one or more redistribution layers (e.g., RDL1 and RDL2 layers) and/or one or more metallization layers (e.g., M3 layer) of the power splitter. In an aspect, the MGFS structure can be formed with thick/tall M3-RDL1-RDL2 metal layers and interlayer dielectric (ILD) vias.

In an aspect, the MGFS may include a single linear row of a plurality of fence posts interconnected by a conductive mesh pattern. In an aspect, the conductive mesh pattern may include a first metallization line directly overlying and electrically interconnecting the single linear row of fence posts, a second metallization line disposed parallel to a first side edge of the first metallization line, a first plurality of perpendicular metallization lines electrically interconnecting the second metallization line and the first metallization line, a third metallization line disposed parallel to a second side edge of the first metallization line, and a second plurality of perpendicular metallization lines electrically interconnecting the third metallization line and the first metallization line.

Figure 8:
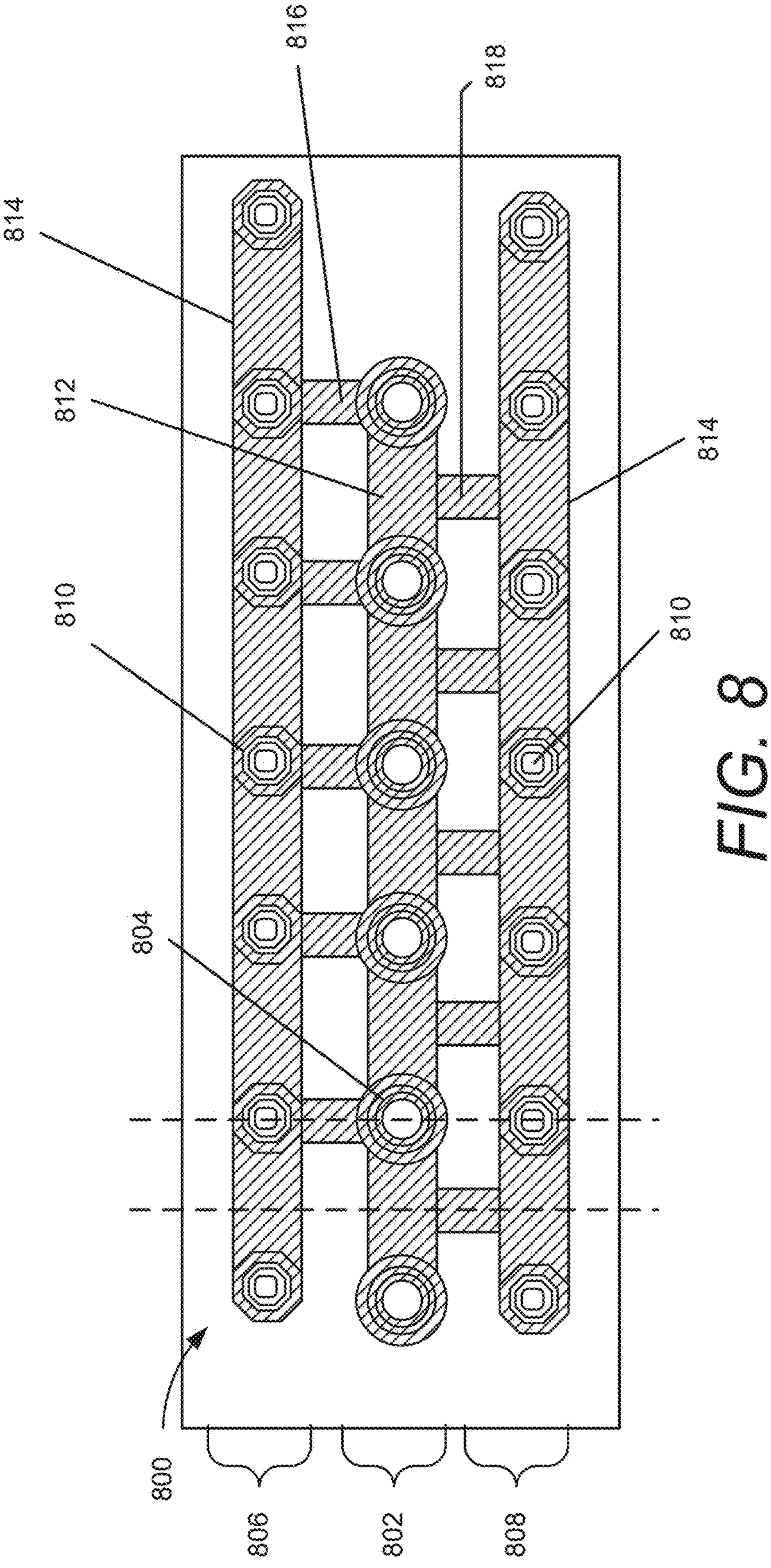
FIG. 8 is a top plan view of another example of an MGFS, according to aspects of the disclosure.

FIG. 8 is a top plan view of another example of an MGFS 800, according to aspects of the disclosure. In this example, the MGFS 800 includes a single row 802 of fence post structures 804 between an opposed pair of rows 806 and 808 of metalized structures 810. The fence post structures 804802 of row 702 are interconnected by a metalized mesh structure. In this example, the metalized mesh structure includes a plurality of metallization structures that electrically interconnect the fence post structures 804 of row 802 and the metalized structures 810 of rows 806 and 808 with one another. In this example, the metalized mesh structure includes a horizontal metallization structure 812 that electrically interconnects the fence post structures 804 of row 802. Additionally, the metallized mesh structure includes a horizontal metallization structure 814 respectively associated with each row 706 and 708. Each horizontal metallization structure 814 electrically interconnects the metallization structures 710 of the respective row.

In FIG. 8, the fence post structures 804 of row 802 are vertically aligned with corresponding metallization structures 810 of the adjacent rows 806 and 808. Accordingly, the metalized mesh structure of the MGFS 800 includes a plurality of metallization structures 816 arranged perpendicular to row 802 that electrically interconnect the fence post structures 804 of row 802 with the metallization structures 810 of the adjacent rows 706 and 708. Additionally, the metalized mesh structure also incorporates a plurality of metallization structures of 818 arranged perpendicular to row 802 that electrically interconnect mid-portions of the horizontal metallization structure 812 with corresponding mid-portions of the horizontal metallization structure 814. As described with respect to the cross-sectional view of the RF device 500 shown in FIG. 5, the metalized mesh structure of the MGFS 800 may be formed from one or more redistribution layers (e.g., RDL1 and RDL2 layers) and/or one or more metallization layers (e.g., M3 layer) of the power splitter.

Figure 9:
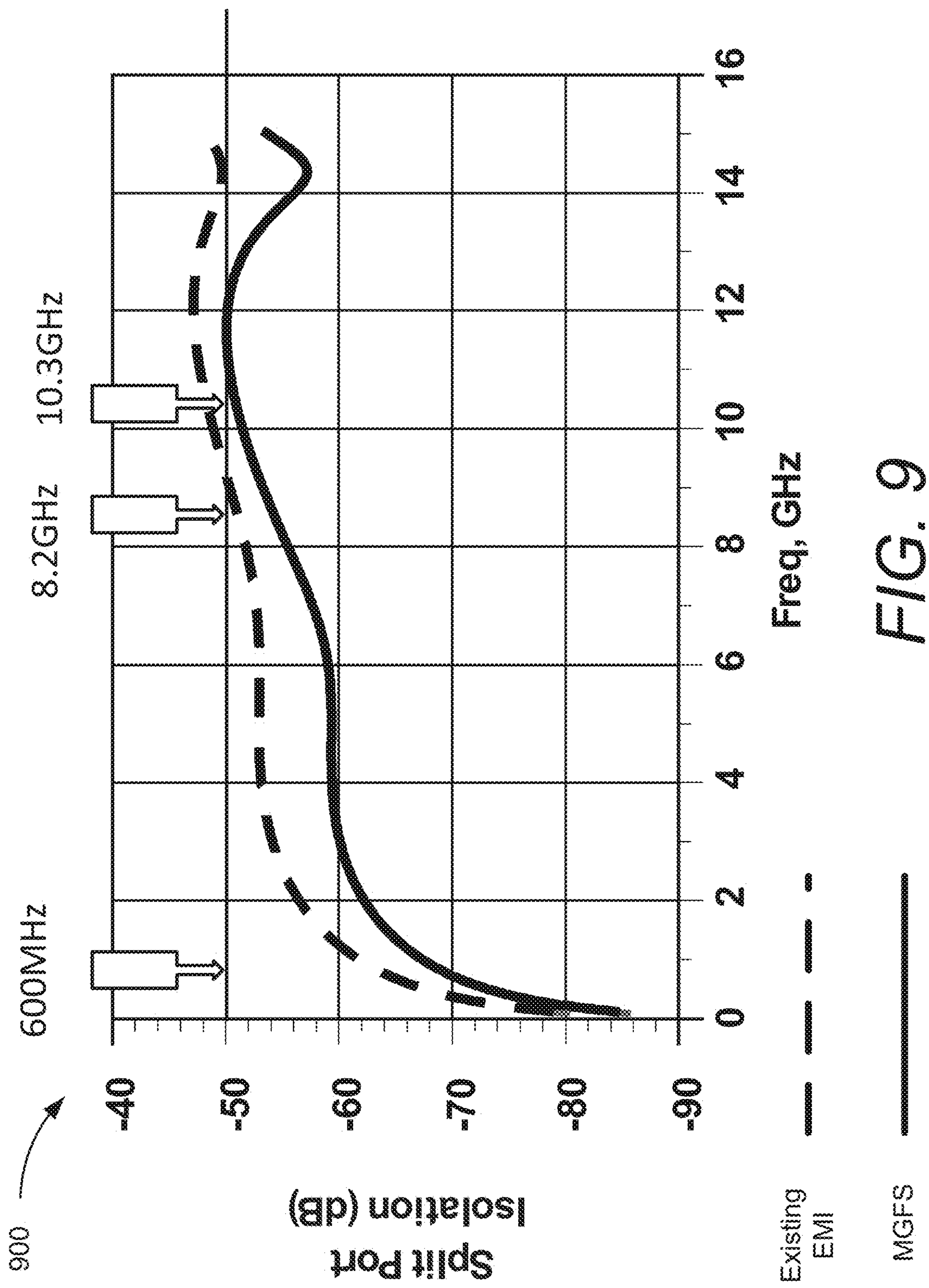
FIG. 9 is a graph comparing the split port isolation characteristics of different EMI isolation structures in an RF power splitter, according to aspects of the disclosure.

FIG. 9 is a graph 900 comparing the split port isolation characteristics of different EMI isolation structures in an RF power splitter, according to aspects of the disclosure. In this example, the target EMI isolation is −50 decibels (dB) at frequencies of 600 megahertz (MHz), 8.2 gigahertz (GHz), and 10.3 GHZ. Although the existing EMI structure provides more than −50 dB of isolation at 600 megahertz, the isolation begins to fall below −50 dB at 8.2 GHz and fails to meet the target −50 dB isolation at 10.3 GHZ. In contrast, an MGFS constructed in accordance with the teachings of the present disclosure readily meets and often exceeds the target −50 dB degree of isolation.

Figure 10:
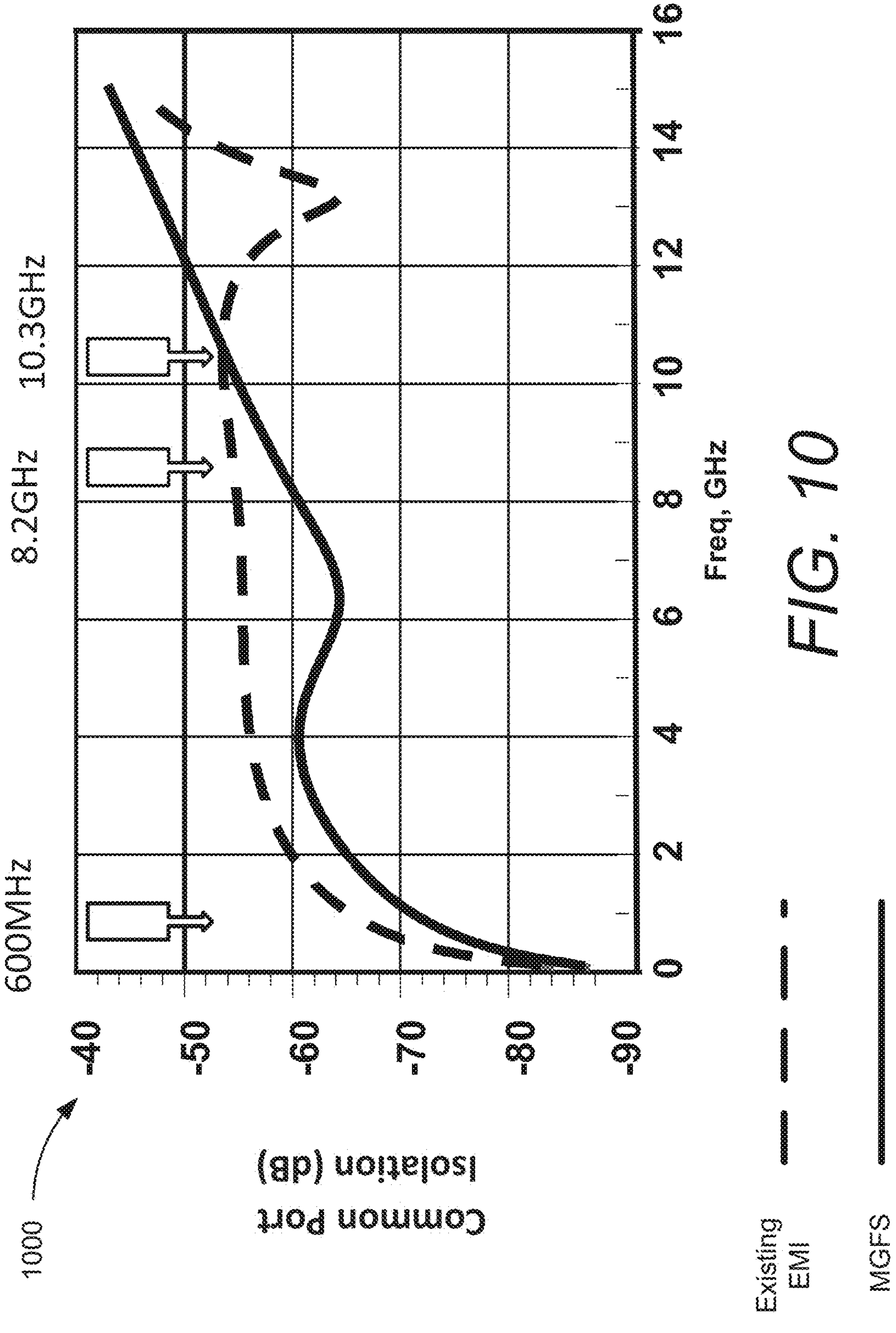
FIG. 10 is a graph comparing the common port isolation characteristics of different EMI isolation structures in an RF power splitter, according to aspects of the disclosure.

FIG. 10 is a graph 1000 comparing the common port isolation characteristics of different EMI isolation structures in an RF power splitter, according to aspects of the disclosure. In this example, the target EMI isolation is −50 decibels (dB) at frequencies of 600 megahertz (MHz), 8.2 gigahertz (GHz), and 10.3 GHZ. Although the existing EMI structure provides more than −50 dB of isolation at 600 megahertz and 8.2 GHz, the isolation decreases significantly below −50 dB beyond 10.3 GHZ. In contrast, an MGFS constructed in accordance with the teachings of the present disclosure readily meets and often exceeds the target −50 dB degree of isolation up to a frequency of about 12 GHz.

Figure 11:
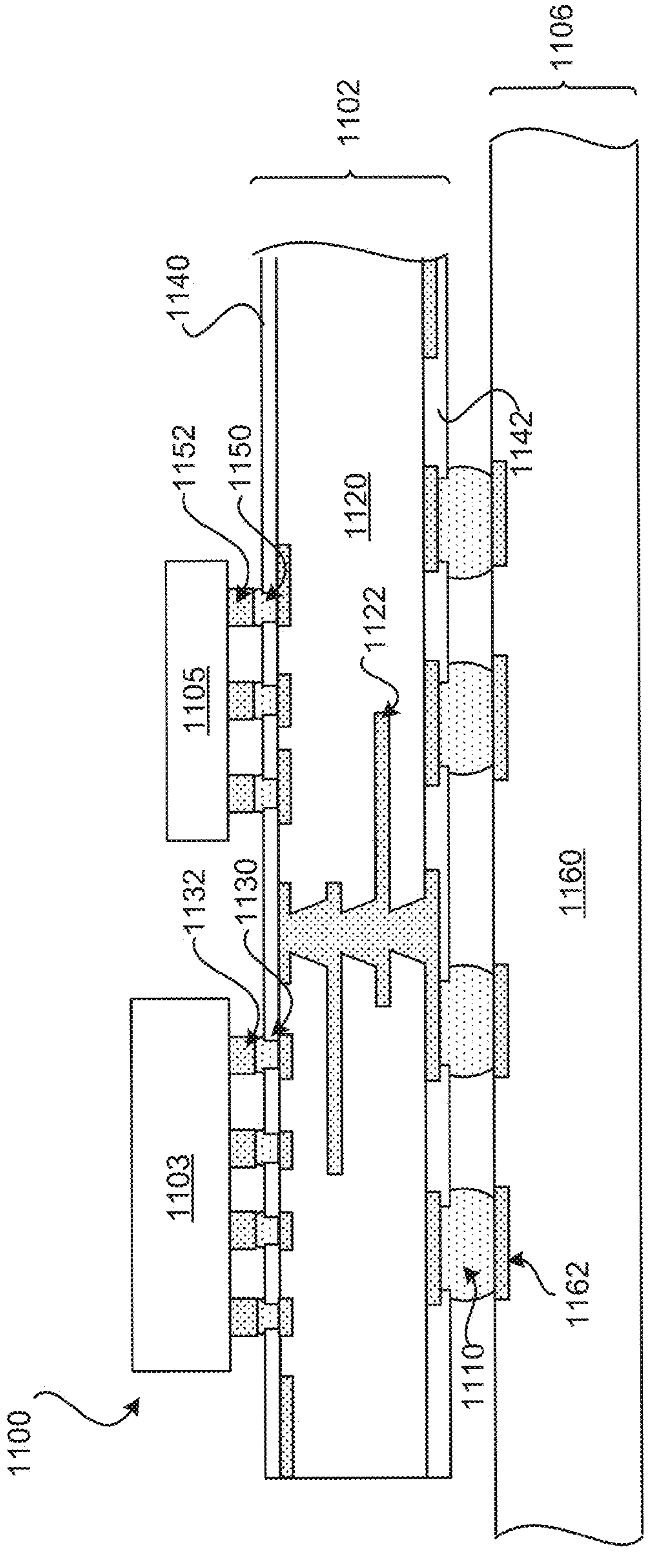
FIG. 11 illustrates a profile view of a package that includes a surface mount substrate, an integrated device, and an integrated passive device, according to aspects of the disclosure.

FIG. 11 illustrates a profile view of a package 1100 that includes a surface mount substrate 1102, an integrated device 1103, and an integrated passive device 1105, according to aspects of the disclosure. The package 1100 may be coupled to a printed circuit board (PCB) 1106 through a plurality of solder interconnects 1110. The PCB 1106 may include at least one board dielectric layer 1160 and a plurality of board interconnects 1162.

The surface mount substrate 1102 includes at least one dielectric layer 1120 (e.g., substrate dielectric layer), a plurality of interconnects 1122 (e.g., substrate interconnects), a solder resist layer 1140 and a solder resist layer 1142. The integrated device 1103 may be coupled to the surface mount substrate 1102 through a plurality of solder interconnects 1130. The integrated device 1103 may be coupled to the surface mount substrate 1102 through a plurality of pillar interconnects 1132 and the plurality of solder interconnects 1130. The integrated passive device 1105 may be coupled to the surface mount substrate 1102 through a plurality of solder interconnects 1150. The integrated passive device 1105 may be coupled to the surface mount substrate 1102 through a plurality of pillar interconnects 1152 and the plurality of solder interconnects 1150.

The package (e.g., 1100) may be implemented in a radio frequency (RF) package. The RF package may be a radio frequency front end (RFFE) package. A package (e.g., 1100) may be configured to provide Wireless Fidelity (WiFi) communication and/or cellular communication (e.g., 2G, 3G, 4G, 5G). The package (e.g., 1100) may be configured to support Global System for Mobile (GSM) Communications, Universal Mobile Telecommunications System (UMTS), and/or Long-Term Evolution (LTE). The package (e.g., 1100) may be configured to transmit and receive signals having different frequencies and/or communication protocols.

Figure 12:
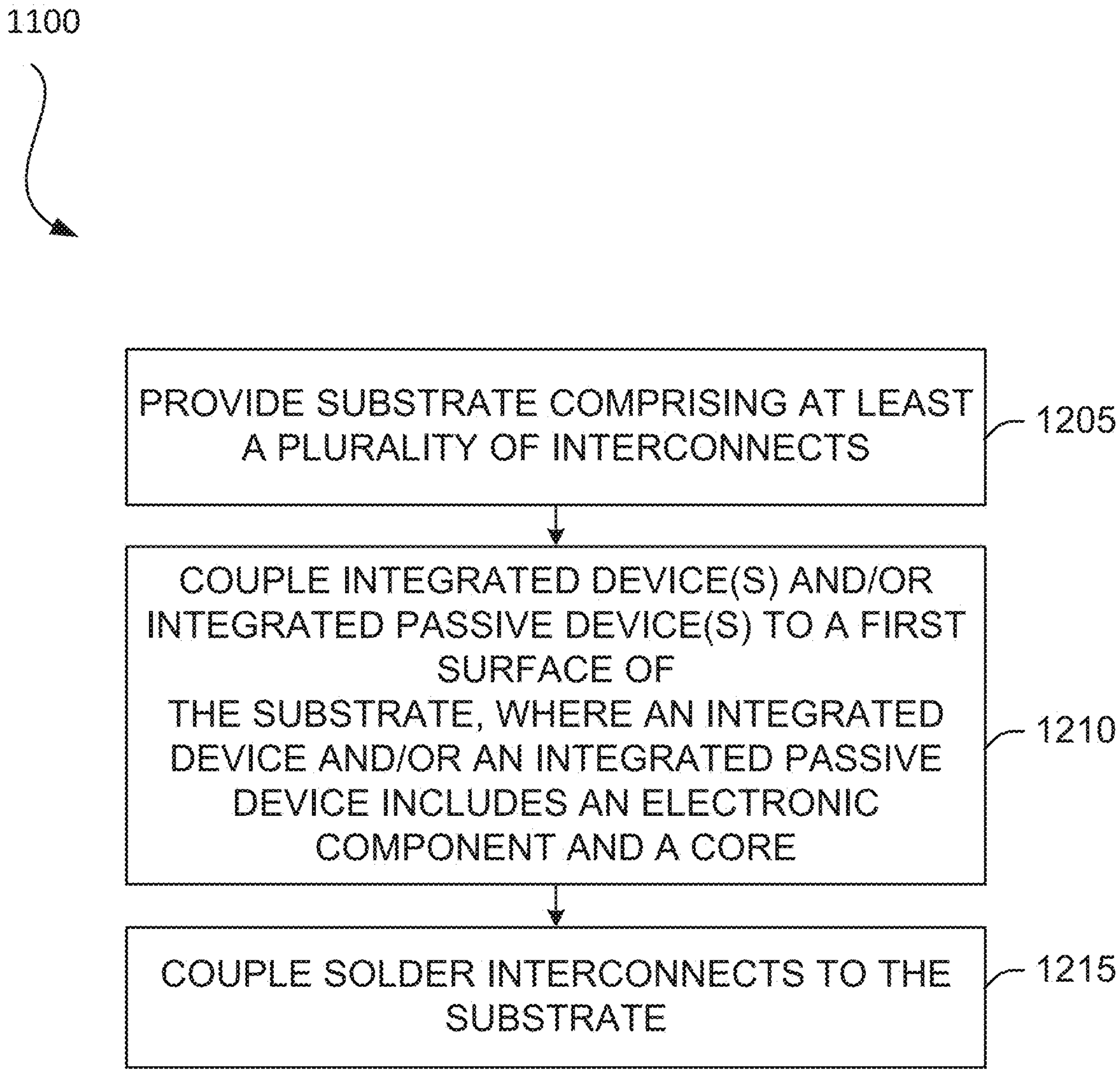
FIG. 12 illustrates an example method for providing or fabricating a package that includes an integrated device comprising a power splitter, according to aspects of the disclosure.

FIG. 12 illustrates an example method 1200 for providing or fabricating a package that includes an integrated device comprising a power splitter, according to aspects of the disclosure. In some implementations, the method 1200 of FIG. 12 may be used to provide or fabricate the package 1100 of FIG. 11 described in the disclosure. However, the method 1200 may be used to provide or fabricate any of the packages described in the disclosure.

It should be noted that the method of FIG. 12 may combine one or more processes in order to simplify and/or clarify the method for providing or fabricating a package that includes an integrated device comprising adjacent logic circuits having back-to-back vias, according to aspects of the disclosure. In some implementations, the order of the processes may be changed or modified.

The method provides (at 1205) a substrate (e.g., 1102). The substrate 1102 may be provided by a supplier or fabricated. The substrate 1102 includes at least one dielectric layer 1120, and a plurality of interconnects 1122. The substrate 1102 may include an embedded trace substrate (ETS). In some implementations, the at least one dielectric layer 1120 may include prepreg layers.

The method couples (at 1210) at least one integrated device (e.g., 1103) to the first surface of the substrate (e.g., 1102). For example, the integrated device 1103 may be coupled to the substrate 1102 through the plurality of pillar interconnects 1132 and the plurality of solder interconnects 1130. The plurality of pillar interconnects 1132 may be optional. The plurality of solder interconnects 1130 are coupled to the plurality of interconnects 1122. A solder reflow process may be used to couple the integrated device 1103 to the plurality of interconnects through the plurality of solder interconnects 1130.

The method also couples (at 1210) at least one integrated passive device (e.g., 1105) to the first surface of the substrate (e.g., 1102). For example, the integrated passive device 1105 may be coupled to the substrate 1102 through the plurality of pillar interconnects 1152 and the plurality of solder interconnects 1150. The plurality of pillar interconnects 1152 may be optional. The plurality of solder interconnects 1150 are coupled to the plurality of interconnects 1122. A solder reflow process may be used to couple the integrated passive device 1105 to the plurality of interconnects through the plurality of solder interconnects 1150.

The method couples (at 1215) a plurality of solder interconnects (e.g., 1110) to the second surface of the substrate (e.g., 1102). A solder reflow process may be used to couple the plurality of solder interconnects 1110 to the substrate.

Figure 13:
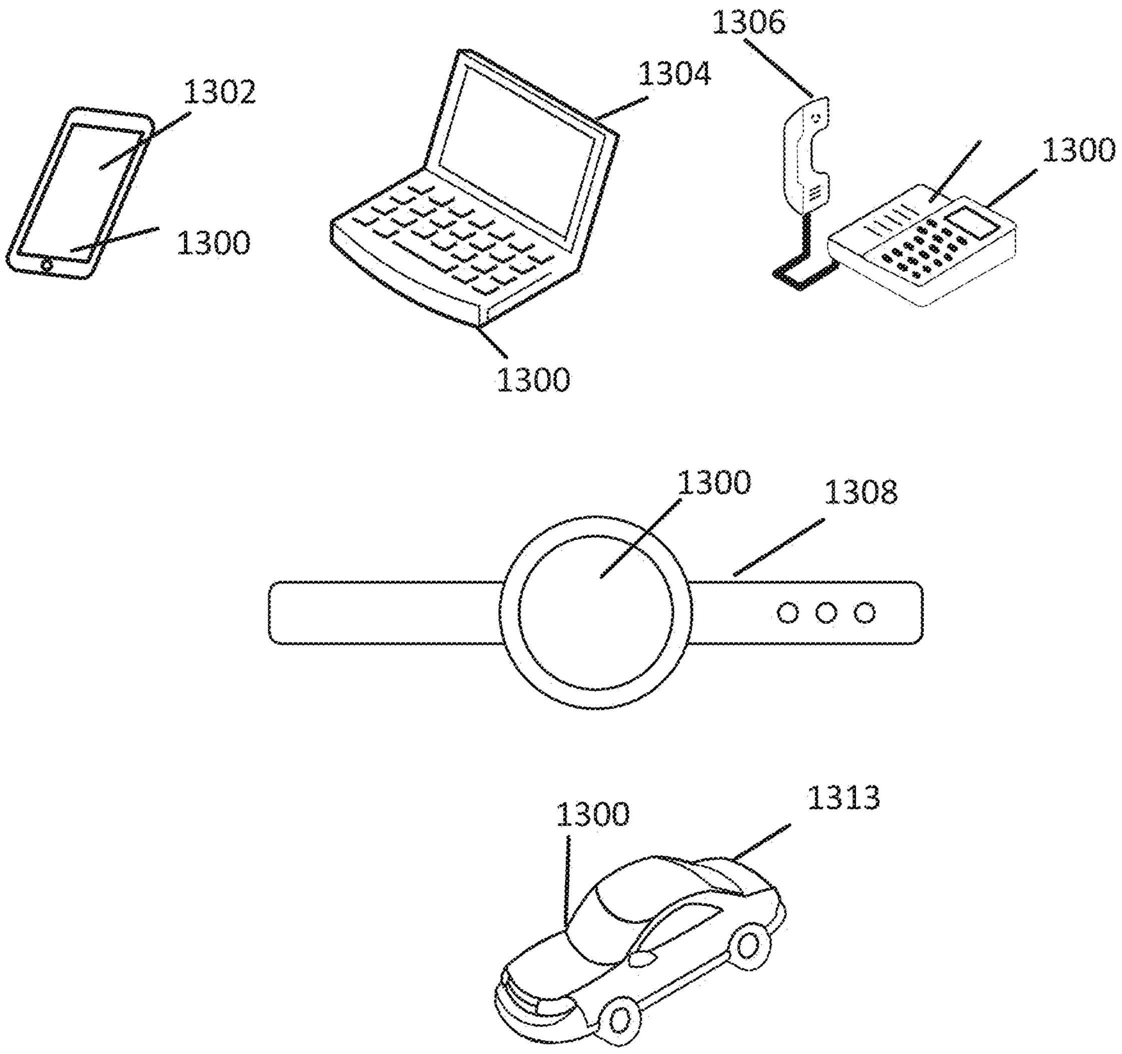
FIG. 13 illustrates various electronic devices that may be integrated with any of the aforementioned devices, integrated devices, integrated circuit (IC) packages, integrated circuit (IC) devices, semiconductor devices, integrated circuits, electronic components, interposer packages, package-on-package (POP), System in Package (SiP), or System on Chip (SoC).

FIG. 13 illustrates various electronic devices that may be integrated with any of the aforementioned devices, integrated devices, integrated circuit (IC) packages, integrated circuit (IC) devices, semiconductor devices, integrated circuits, electronic components, interposer packages, package-on-package (POP), System in Package (SiP), or System on Chip (SoC). For example, a mobile phone device 1302, a laptop computer device 1304, a fixed location terminal device 1306, a wearable device 1308, or automotive vehicle 1313 may include a device 1300 as described herein. The device 1300 may be, for example, any of the devices and/or integrated circuit (IC) packages described herein. The devices 1302, 1304, 1306 and 1308 and the vehicle 1313 illustrated in FIG. 13 are merely exemplary. Other electronic devices may also feature the device 1300 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

Implementation examples are described in the following numbered aspects:

Aspect 1. An electronic device, comprising: at least a first radio frequency (RF) path structure and a second RF path structure; and an electromagnetic shield disposed between the first RF path structure and the second RF path structure, the electromagnetic shield comprising a plurality of fence posts extending through at least one dielectric layer and having first ends electrically connected to a common ground metallization layer, and at least one metallization layer overlying the at least one dielectric layer and electrically interconnecting second ends of the plurality of fence posts, wherein the at least one metallization layer interconnects the second ends of the plurality of fence posts in a conductive mesh pattern.

Aspect 2. The electronic device of aspect 1, wherein: the plurality of fence posts comprise a plurality of metallization vias extending through a first dielectric layer overlying a substrate structure, wherein the ground metallization layer is disposed in the substrate structure.

Aspect 3. The electronic device of aspect 2, wherein: the at least one metallization layer comprises at least one redistribution layer overlying the first dielectric layer.

Aspect 4. The electronic device of any of aspects 1 to 3, wherein: the at least one dielectric layer comprises an encapsulated molding compound.

Aspect 5. The electronic device of any of aspects 1 to 4, wherein: the plurality of fence posts comprise copper pillar structures extending through the at least one dielectric layer.

Aspect 6. The electronic device of any of aspects 1 to 5, wherein: the plurality of fence posts are arranged in at least three linear rows so that fence posts of adjacent linear rows of the at least three linear rows are arranged as diagonally oriented sets of fence posts; and the conductive mesh pattern comprises a plurality of diagonally oriented metallization lines electrically interconnecting each set of the diagonally oriented sets of fence posts.

Aspect 7. The electronic device of any of aspects 1 to 5, wherein: the plurality of fence posts are arranged as a single linear row; and the conductive mesh pattern comprises a primary linear metallization line electrically interconnecting each fence post of the plurality of fence posts, one or more linear metallization lines parallel to the primary linear metallization line, and a plurality of diagonally oriented metallization lines electrically interconnecting the one or more linear metallization lines with the primary linear metallization line.

Aspect 8. The electronic device of any of aspects 1 to 5, wherein: the plurality of fence posts comprise a single linear row of fence posts: and the conductive mesh pattern comprises a first metallization line directly overlying and electrically interconnecting the single linear row of fence posts, and a second metallization line disposed parallel to a first side edge of the first metallization line, a first plurality of perpendicular metallization lines electrically interconnecting the second metallization line and the first metallization line, a third metallization line disposed parallel to a second side edge of the first metallization line, and a second plurality of perpendicular metallization lines electrically interconnecting the third metallization line and the first metallization line.

Aspect 9. The electronic device of any of aspects 1 to 8, wherein the electronic device comprises at least one of: a music player; a video player; an entertainment unit; a navigation device; a communications device; a mobile device; a mobile phone; a smartphone; a personal digital assistant; a fixed location terminal; a tablet computer, a computer; a wearable device; a laptop computer; a server; an internet of things (IoT) device; or a device in an automotive vehicle.

Aspect 10. A radio frequency (RF) splitter, comprising: a first set of electronic components configured to pass first RF signals; a second set of electronic components configured to pass second RF signals; and a plurality of fence posts extending through at least one dielectric layer and between the first set of electronic components and the second set of electronic components, wherein the plurality of fence posts have first ends electrically connected to a common ground metallization layer, and at least one metallization layer overlying the at least one dielectric layer and electrically interconnecting second ends of the plurality of fence posts, wherein the at least one metallization layer interconnects the second ends of the plurality of fence posts in a conductive mesh pattern.

Aspect 11. The RF splitter of aspect 10, wherein: the first set of electronic components and second set of electronic components have interior edges adjacent to the plurality of fence posts and the at least one metallization layer, and the interior edges are spaced equal to or less than 400 micrometers.

Aspect 12. The RF splitter of any of aspects 10 to 11, wherein: the first and second set of electronic components, the plurality of fence posts, and the at least one metallization layer are formed as a hybrid integrated passive (HIP) chip.

Aspect 13. The RF splitter of any of aspects 10 to 12, wherein: the plurality of fence posts comprise a plurality of metallization vias extending through a first dielectric layer overlying a substrate structure, wherein the ground metallization layer is disposed in the substrate structure.

Aspect 14. The RF splitter of aspect 13, wherein: the at least one metallization layer comprises at least one redistribution layer overlying the at least one dielectric layer.

Aspect 15. The RF splitter of any of aspects 10 to 14, wherein: the at least one dielectric layer comprises an encapsulated molding compound.

Aspect 16. The RF splitter of any of aspects 10 to 15, wherein: the plurality of fence posts comprise copper pillar structures extending through the at least one dielectric layer.

Aspect 17. The RF splitter of any of aspects 10 to 16, wherein: the plurality of fence posts are arranged in at least three linear rows so that fence posts of adjacent linear rows of the at least three linear rows are arranged as diagonally oriented sets of fence posts; and the conductive mesh pattern comprises a plurality of diagonally oriented metallization lines electrically interconnecting each set of the diagonally oriented sets of fence posts.

Aspect 18. The RF splitter of any of aspects 10 to 16, wherein: the plurality of fence posts comprise a single linear row of fence posts; and the conductive mesh pattern comprises a first metallization line directly overlying and electrically interconnecting the single linear row of fence posts, and a second metallization line disposed parallel to a first side edge of the first metallization line, a first plurality of perpendicular metallization lines electrically interconnecting the second metallization line and the first metallization line, a third metallization line disposed parallel to a second side edge of the first metallization line, and a second plurality of perpendicular metallization lines electrically interconnecting the third metallization line and the first metallization line.

Aspect 19. The RF splitter of any of aspects 10 to 16, wherein: the first set of electronic components are configured to pass RF signals having a vertical polarity; and the second set of electronic components are configured to pass RF signals having a horizontal polarity.

Aspect 20. A customer premises equipment (CPE), comprising: a substrate; a plurality of antennas overlying a first side of the substrate; and a hybrid integrated passive (HIP) chip overlying a second side of the substrate, wherein the HIP includes a radio frequency (RF) power splitter comprising: a first RF path structure configured to pass a first RF signal to at least a first antenna of the plurality of antennas; a second RF path structure configured to pass a second RF signal to at least a second antenna of the plurality of antennas an electromagnetic shield disposed between the first RF path structure and the second RF path structure, the electromagnetic shield comprising: a plurality of fence posts extending through at least one encapsulated molding compound layer and having first ends electrically connected to a common ground metallization layer at the second side of the substrate, and at least one metallization layer overlying the at least one encapsulated molding compound layer and electrically interconnecting second ends of the plurality of fence posts, wherein the at least one metallization layer interconnects the second ends of the plurality of fence posts in a conductive mesh pattern.

It is noted that the figures in the disclosure may represent actual representations and/or conceptual representations of various parts, components, objects, devices, packages, integrated devices, integrated circuits, and/or transistors. In some instances, the figures may not be to scale. In some instances, for the purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on the bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under-bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metallization layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the detailed description above, it can be seen that different features are grouped together in examples. This manner of disclosure should not be understood as an intention that the example aspects have more features than are explicitly mentioned in each aspect. Rather, the various aspects of the disclosure may include fewer than all features of an individual example aspect disclosed. Therefore, the following aspects should hereby be deemed to be incorporated in the description, wherein each aspect by itself can stand as a separate example. Although each dependent aspect can refer in the aspects to a specific combination with one of the other aspects, the aspect(s) of that dependent aspect are not limited to the specific combination. It will be appreciated that other example aspects can also include a combination of the dependent aspect(s) with the subject matter of any other dependent aspect or independent aspect or a combination of any feature with other dependent and independent aspects. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of an aspect can be included in any other independent aspect, even if the aspect is not directly dependent on the independent aspect.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An electronic device, comprising:

at least a first radio frequency (RF) path structure and a second RF path structure; and an electromagnetic shield disposed between the first RF path structure and the second RF path structure, the electromagnetic shield comprising:

a plurality of fence posts extending through at least one dielectric layer and having first ends electrically connected to a common ground metallization layer, and at least one metallization layer overlying the at least one dielectric layer and electrically interconnecting second ends of the plurality of fence posts, wherein the at least one metallization layer interconnects the second ends of the plurality of fence posts in a conductive mesh pattern.

2. The electronic device of claim 1, wherein:

the plurality of fence posts comprise a plurality of metallization vias extending through a first dielectric layer overlying a substrate structure, wherein the ground metallization layer is disposed in the substrate structure.

3. The electronic device of claim 2, wherein:

the at least one metallization layer comprises at least one redistribution layer overlying the first dielectric layer.

4. The electronic device of claim 1, wherein:

the at least one dielectric layer comprises an encapsulated molding compound.

5. The electronic device of claim 1, wherein:

the plurality of fence posts comprise copper pillar structures extending through the at least one dielectric layer.

6. The electronic device of claim 1, wherein:

the plurality of fence posts are arranged in at least three linear rows so that fence posts of adjacent linear rows of the at least three linear rows are arranged as diagonally oriented sets of fence posts; and the conductive mesh pattern comprises:

a plurality of diagonally oriented metallization lines electrically interconnecting each set of the diagonally oriented sets of fence posts.

7. The electronic device of claim 1, wherein:

the plurality of fence posts are arranged as a single linear row; and the conductive mesh pattern comprises:

a primary linear metallization line electrically interconnecting each fence post of the plurality of fence posts, one or more linear metallization lines parallel to the primary linear metallization line, and a plurality of diagonally oriented metallization lines electrically interconnecting the one or more linear metallization lines with the primary linear metallization line.

8. The electronic device of claim 1, wherein:

the plurality of fence posts comprise a single linear row of fence posts; and the conductive mesh pattern comprises:

a first metallization line directly overlying and electrically interconnecting the single linear row of fence posts, a second metallization line disposed parallel to a first side edge of the first metallization line, a first plurality of perpendicular metallization lines electrically interconnecting the second metallization line and the first metallization line, a third metallization line disposed parallel to a second side edge of the first metallization line, and a second plurality of perpendicular metallization lines electrically interconnecting the third metallization line and the first metallization line.

9. The electronic device of claim 1, wherein the electronic device comprises at least one of:

a music player;

a video player;
an entertainment unit;
a navigation device;
a communications device;
a mobile device;
a mobile phone;
a smartphone;
a personal digital assistant;
a fixed location terminal;
a tablet computer, a computer;
a wearable device;
a laptop computer;
a server;
an internet of things (IoT) device; or
a device in an automotive vehicle.

10. A radio frequency (RF) splitter, comprising:
a first set of electronic components configured to pass first RF signals;
a second set of electronic components configured to pass second RF signals;
a plurality of fence posts extending through at least one dielectric layer and between the first set of electronic components and the second set of electronic components, wherein the plurality of fence posts have first ends electrically connected to a common ground metallization layer; and
at least one metallization layer overlying the at least one dielectric layer and electrically interconnecting second ends of the plurality of fence posts, wherein the at least one metallization layer interconnects the second ends of the plurality of fence posts in a conductive mesh pattern.

11. The RF splitter of claim 10, wherein:
the first set of electronic components and second set of electronic components have interior edges adjacent to the plurality of fence posts and the at least one metallization layer, and the interior edges are spaced equal to or less than 400 micrometers.

12. The RF splitter of claim 10, wherein:
the first and second set of electronic components, the plurality of fence posts, and the at least one metallization layer are formed as a hybrid integrated passive (HIP) chip.

13. The RF splitter of claim 10, wherein:
the plurality of fence posts comprise a plurality of metallization vias extending through a first dielectric layer overlying a substrate structure, wherein the ground metallization layer is disposed in the substrate structure.

14. The RF splitter of claim 13, wherein:
the at least one metallization layer comprises at least one redistribution layer overlying the at least one dielectric layer.

15. The RF splitter of claim 10, wherein:
the at least one dielectric layer comprises an encapsulated molding compound.

16. The RF splitter of claim 10, wherein:
the plurality of fence posts comprise copper pillar structures extending through the at least one dielectric layer.

17. The RF splitter of claim 10, wherein:
the plurality of fence posts are arranged in at least three linear rows so that fence posts of adjacent linear rows of the at least three linear rows are arranged as diagonally oriented sets of fence posts; and
the conductive mesh pattern comprises:
a plurality of diagonally oriented metallization lines electrically interconnecting each set of the diagonally oriented sets of fence posts.

18. The RF splitter of claim 10, wherein:
the plurality of fence posts comprise a single linear row of fence posts; and
the conductive mesh pattern comprises:
a first metallization line directly overlying and electrically interconnecting the single linear row of fence posts,
a second metallization line disposed parallel to a first side edge of the first metallization line,
a first plurality of perpendicular metallization lines electrically interconnecting the second metallization line and the first metallization line,
a third metallization line disposed parallel to a second side edge of the first metallization line, and
a second plurality of perpendicular metallization lines electrically interconnecting the third metallization line and the first metallization line.

19. The RF splitter of claim 10, wherein:
the first set of electronic components are configured to pass RF signals having a vertical polarity; and
the second set of electronic components are configured to pass RF signals having a horizontal polarity.

20. A customer premises equipment (CPE), comprising:
a substrate;
a plurality of antennas overlying a first side of the substrate; and
a hybrid integrated passive (HIP) chip overlying a second side of the substrate, wherein the HIP includes a radio frequency (RF) power splitter comprising:
a first RF path structure configured to pass a first RF signal to at least a first antenna of the plurality of antennas;
a second RF path structure configured to pass a second RF signal to at least a second antenna of the plurality of antennas; and
an electromagnetic shield disposed between the first RF path structure and the second RF path structure, the electromagnetic shield comprising:
a plurality of fence posts extending through at least one encapsulated molding compound layer and having first ends electrically connected to a common ground metallization layer at the second side of the substrate, and
at least one metallization layer overlying the at least one encapsulated molding compound layer and electrically interconnecting second ends of the plurality of fence posts, wherein the at least one metallization layer interconnects the second ends of the plurality of fence posts in a conductive mesh pattern.

* * * * *